(12) United States Patent
Ofir et al.

(10) Patent No.: US 7,846,642 B2
(45) Date of Patent: Dec. 7, 2010

(54) DIRECT INCIDENT BEAM LITHOGRAPHY FOR PATTERNING NANOPARTICLES, AND THE ARTICLES FORMED THEREBY

(75) Inventors: Yuval Ofir, Amherst, MA (US); Vincent Martin Rotello, Amherst, MA (US); Mark Thomas Tuominen, Shutesbury, MA (US); Qijun Xiao, Amherst, MA (US); Bappaditya Samanta, Amherst, MA (US)

(73) Assignee: The University of Massachusetts, Boston, MA (US)

( * ) Notice: Subject to any disclaimer, the term of this patent is extended or adjusted under 35 U.S.C. 154(b) by 0 days.

(21) Appl. No.: 12/193,437

(22) Filed: Aug. 18, 2008

(65) Prior Publication Data

US 2009/0047485 A1 Feb. 19, 2009

Related U.S. Application Data

(60) Provisional application No. 60/956,515, filed on Aug. 17, 2007.

(51) Int. Cl.
*G03F 7/26* (2006.01)
*G03F 7/20* (2006.01)

(52) U.S. Cl. ................................. 430/311; 430/394
(58) Field of Classification Search ................ 430/311, 430/322, 5, 256, 394
See application file for complete search history.

(56) References Cited

U.S. PATENT DOCUMENTS 5,328,534 A * 7/1994 Calhoun et al. ............. 156/150
6,309,798 B1 * 10/2001 Reetz et al. ................. 430/296
6,664,027 B2 * 12/2003 Griffith et al. .............. 430/311
7,344,605 B2 3/2008 Ono et al.
2002/0104762 A1 * 8/2002 Stonas et al. ............... 205/118

FOREIGN PATENT DOCUMENTS

EP 0672765 9/1995
WO 9218246 10/1992

OTHER PUBLICATIONS

Saitoh, et al., "Manipulation of Vortex Circulation in Decentered Ferromagnetic Nanorings," Journal of Applied Physics, vol. 95, No. 4, pp. 1985-1988 (Feb. 2004).

* cited by examiner

*Primary Examiner*—Kathleen Duda
*Assistant Examiner*—Caleen O Sullivan
(74) *Attorney, Agent, or Firm*—Cantor Colburn LLP

(57) ABSTRACT

Disclosed herein is a method for generating a three-dimensional structure on a surface. The method comprises forming a layer comprising a plurality of nanoparticles on a surface; and exposing a portion of the layer to incident radiation having a defined pattern at a dosage effective to aggregate the nanoparticles in the exposed portion of the layer into a three-dimensional structure, wherein the three-dimensional structure has a shape defined by the pattern of the radiation and a height defined by the dosage of the incident radiation and a thickness of the nanoparticle layer. Alternatively, the method comprises forming a layer comprising a plurality of nanoparticles on a surface of a three-dimensional template; and exposing at least a portion of the layer to incident radiation at a dosage effective to aggregate the nanoparticles in the exposed portion of the layer into a three-dimensional structure that corresponds to the three-dimensional template.

14 Claims, 15 Drawing Sheets

FIG. 11
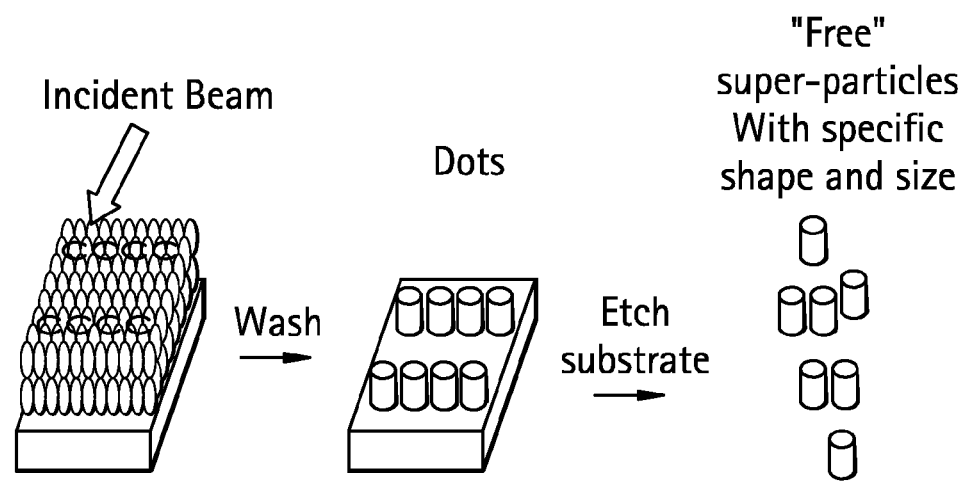
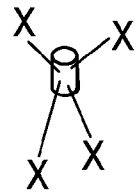
◻ = metallic magnetic or semiconductor super-particle
X = an organic or inorganic compound, a dye, a polymer, a nanoparticle, a nanocrystal, a nanotube, a nanowire, a biomolecule, a drug, an enzyme, an antibody, an antigen, a metabolite, a peptide, a protein, DNA, RNA, mRNA, tRNA, siRNA, and the like.

PMMA on Si

Unexposed PMMA
E-Beam exposed PMMA

Unexposed PMMA
Si substrate after removal of the PMMA

—— After Annealing
------ Before Annealing

DIRECT INCIDENT BEAM LITHOGRAPHY FOR PATTERNING NANOPARTICLES, AND THE ARTICLES FORMED THEREBY

CROSS-REFERENCE TO RELATED PATENT APPLICATIONS

This application claims the benefit of U.S. provisional application Ser. No. 60/956,515, filed Aug. 17, 2007, which is incorporated by reference herein in its entirety.

The U.S. Government has a paid-up license in this invention and the right in limited circumstances to require the patent owner to license others on reasonable terms as provided for by the terms of Grant No. DMI-0531171 awarded by the National Science Foundation.

BACKGROUND

This disclosure relates to methods for forming direct incident beam lithographic patterns in nanoparticle layers, and the articles formed thereby.

Industrial microelectronic applications typically use photolithography methods for the generation of micrometer-sized patterns, for example conductor tracks. Advances in technology and the demand for smaller electronics have led to further miniaturization of the patterns sought. For example, reducing the dimensions of functional elements can increase the scale of integration of silicon circuits. Current photolithography methods can be used to achieve patterns on a hundreds of nanometer scale. Such photolithographic methods are useful for the generation of one- and two-dimensional structures, that is, points (one-dimensional) and lines (two-dimensional).

Alternative methods for the formation of nanostructures on surfaces have been described, for example "direct write" methods such as electron beam lithography. In direct write methods, no mask is used to generate the final pattern. Instead, the final pattern is created directly, for example from a digital representation on a computer, by controlling an electron beam as it scans across a resist-coated substrate. Such methods have also been described for the formation of one- and two-dimensional patterns, for example in U.S. Pat. No. 6,309,798 to Reetz.

SUMMARY

Disclosed herein is a method for generating a three-dimensional structure using direct incident beam lithography.

In one embodiment, the method comprises forming a layer comprising a plurality of nanoparticles on a surface; and exposing a portion of the layer to incident radiation having a defined pattern at a dosage effective to aggregate the nanoparticles in the exposed portion of the layer into a three-dimensional structure, wherein the three-dimensional structure has a shape defined by the pattern of the radiation and a height as defined by the dosage of the incident radiation and a thickness of the nanoparticle layer. After removal of the non-aggregated nanoparticles, the aggregated shape remains.

In another embodiment, the method comprises forming a layer comprising a plurality of nanoparticles on a surface of a three-dimensional template; and exposing at least a portion of the layer to incident radiation at a dosage effective to aggregate the nanoparticles in the exposed portion of the layer into a three-dimensional structure that corresponds to the three-dimensional template. All of the layer can be exposed, or only a portion thereof.

In still another embodiment, a method for forming a nanocomposite comprises: forming a first layer comprising a plurality of nanoparticles on a substrate; exposing a portion of the layer to incident radiation having a defined pattern at a dosage effective to aggregate the nanoparticles in the exposed portion of the layer into an array of individual particles with a shape and size defined by the dosage, location and pattern of the incident radiation; removing the unexposed portion; forming a second layer comprising a second plurality of nanoparticles filling the spaces between the individual particles; and exposing the second layer to radiation to aggregate the second plurality of nanoparticles to form a continuous phase of aggregated nanoparticles surrounding the array of individual particles.

Articles made by the foregoing methods are also described.

The above discussed and other features and advantages of the present invention will be appreciated and understood by those skilled in the art from the following detailed description and drawings.

BRIEF DESCRIPTION OF FIGURES

Referring now to the Figures, which are exemplary embodiments and wherein the like elements are numbered alike:

FIG. 11 illustrates an exemplary process for the formation of chemically or biologically functionalized free suspended super-particles with specific sizes and shapes.

DETAILED DESCRIPTION

Disclosed herein is a method of directly writing metallic, magnetic, semiconducting, and insulator patterned surfaces in three dimensions. In one embodiment, the structures are formed by exposing a portion of a layer of nanoparticles to incident radiation, thereby causing the particles to aggregate into a shape corresponding to the exposed portion of the layer. In a particularly advantageous feature, it has been found that the geometry of the structure patterns can be controlled in three dimensions by varying the location and dosage of radiation impinging on the nanoparticle layer. As used herein, the term 'dosage' is generally intended to refer to, without limitation, the duration, intensity, and the like, of the incident radiation. In another embodiment, a layer of nanoparticles is disposed onto a three-dimensional template, and exposed to incident radiation, thereby causing the nanoparticles to aggregate in the shape of the template. The template can subsequently be removed, or left in place. The structures formed using this method can be nanoscale or larger.

Figure 1:
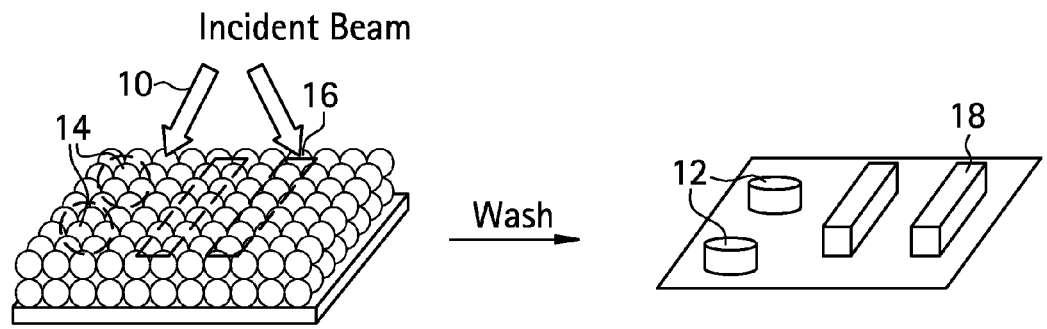
FIG. 1 illustrates an exemplary embodiment of the method for generating structures on a surface as disclosed herein, where the method is used to generate a one-dimensional and a two-dimensional structure.

As used herein, the term "direct-write" refers to the direct patterning of a layer of nanoparticles with incident radiation to create the nanostructures. FIG. 1 illustrates two examples of the direct-write process. In FIG. 1, an incident beam 10 is used to form a one-dimensional structure 12 (a point). Where the incident beam 10 impinges on the layer of nanoparticles 14, the nanoparticles aggregate. After removal of the non-aggregated nanoparticles, the aggregated shape 12 remains. Removal can be accomplished mechanically, or by etching, or dissolving. When the exposed portion of the layer of nanoparticles is line-shaped, as at 16, a two-dimensional structure 18 (a line) is formed.

Figure 2:
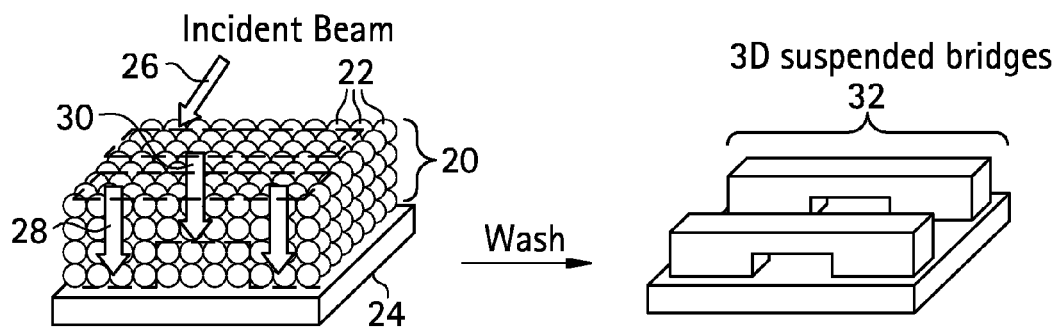
FIG. 2 illustrates an exemplary embodiment of the method for generating structures on a surface as disclosed herein, where the method is used to generate a three-dimensional structure (a suspended bridge).

In accordance with one aspect of the present invention, a three-dimensional structure is created by appropriate selection of the location and dosage of the impinging radiation. The process is illustrated generally in FIG. 2. In FIG. 2, a layer 20 of nanoparticles 22 is present on a substrate 24. Incident beams of radiation 26 is adjusted to different dosages 28 and 30 and applied to different portions of the layer 20 to form the three-dimensional suspended bridge structures 32. The incident radiation can be electron beam, proton beam, ion beam, ultraviolet (UV), infrared (IR), X-ray, or other high-energy radiation. The nanoparticles aggregate, e.g., by crosslinking, in the exposed areas to form geometrical patterns depending on the geometry of the incident exposure. The geometry of the patterns can be controlled in one, two, or three dimensions by varying the location and dosage of radiation exposure. One or both variables (location and dosage) can be controlled by computer. Use of a higher dosage beam will result in formation of a thicker aggregate within the nanoparticle layer. The nanoparticles at the unexposed areas are removed after the exposed nanoparticles have aggregated. Thus, by changing the location and dosage of the radiation exposure, a three-dimensional nanostructure can be formed.

Figure 3:
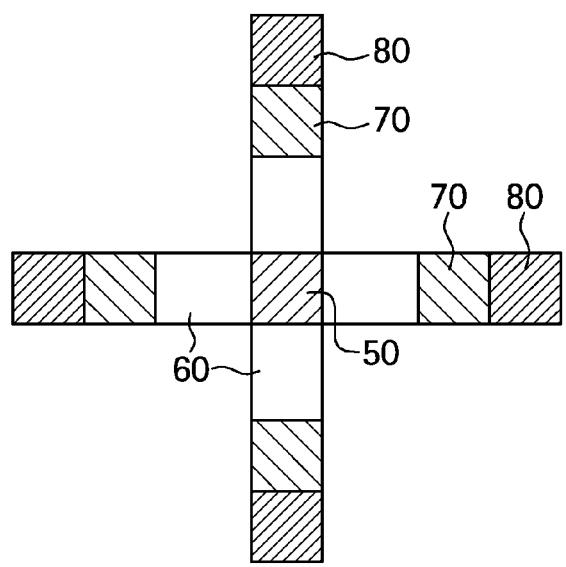
FIG. 3 is a top-down perspective view of an exemplary dosing pattern that can be used to generate a three-dimensional structure.
Figure 4:
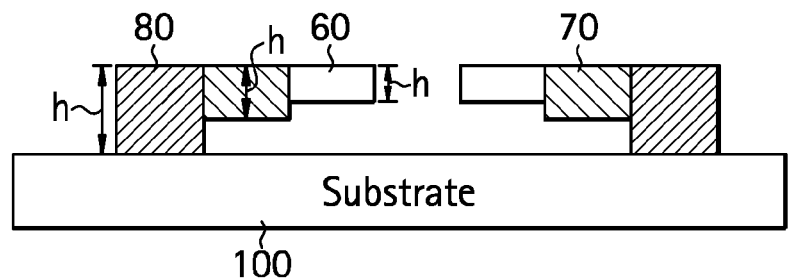
FIG. 4 is a cross-sectional perspective view of the three-dimensional structure generated by the pattern of FIG. 3.

FIGS. 3 and 4 illustrate a specific example of direct three-dimensional writing in a nanoparticle layer. FIG. 3 is a top perspective view of a pattern of exposure of a nanoparticle layer, wherein each section represents a different dosage of exposure. The region indicated by reference numeral 50 is an example of a dosage X of radiation. The region 60 is exposed to a dosage greater than that of region 50, e.g., a dosage of 2X. Likewise, region 70 and region 80 are higher doses still, e.g., 3X and 4X respectively. A side perspective view of the resulting structure disposed on substrate 100 is shown in FIG. 4, after removal of the non-aggregated nanoparticles.

The shape and height ("h" in FIG. 4) of each section of the structure corresponds to the shape and dosage of FIG. 3. In this specific example, radiation of dosage X is insufficient to cause permanent aggregation of the nanoparticles, and the corresponding exposed portions of the nanoparticles are removed. Rather than using a low dose of radiation, the impinging pattern of radiation can be shaped so as to exclude area 50. Alternatively, a mask can be used over area 50 and/or any other area where no pattern is desired.

The shape (i.e., outline or footprint) of the structures 60, 70, and 80 arising from the exposed (aggregated) portions is determined by the shape (i.e., outline or footprint) of the impinging radiation. A variety of shapes are possible, for example square as shown, as well as linear, circular, rectangular, polygonal, irregular, and the like. The pattern may also be in the form of symmetric and asymmetric rings, bull's eye patterns, crosses, L-shapes, parallel lines, perpendicular lines, a crescent moon, a crosshatch pattern, or lines intersecting at any angle. In an important feature of the present process, the height of the structures 60, 70, and 80 are determined by strength of the dosage, as well as the original thickness of the nanoparticle layer.

The structures generated by this method can have a width, length, and elevation of about 2 nanometers (nm) to about 5 micrometers (μm), specifically about 5 nanometers to about 2 micrometers.

Figure 5:
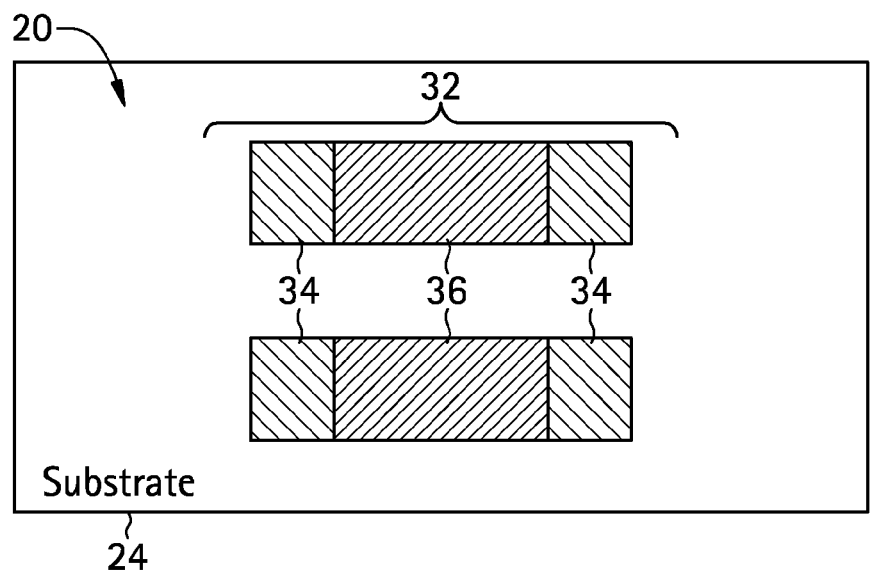
FIG. 5 is a top-down perspective view of the dosing patterns used to form the three-dimensional suspended bridges of FIG. 2.

Even more complex structures, such as the suspended bridge 32 of FIG. 2 can be formed using the proper pattern or sequence of patterns as shown in FIG. 5. FIG. 5 is a top-down perspective view of the dosing patterns used to form the three-dimensional suspended bridges 32 of FIG. 2. The first dosage 28 of radiation can be applied to regions 34 of the nanoparticle layer 20 to aggregate the nanoparticles in the regions and form the supports (i.e., stanchions) of the suspended bridge structure 32. The second dosage 30 of the radiation can then be applied to the region 36 of the nanoparticle layer 20 to aggregate the nanoparticles therein and form the span of the bridge, which connects the regions 34 to form the three-dimensional suspended bridge structure 32. The first dosage 28 is an example of a radiation dosage sufficient enough to form aggregate the full thickness of the nanoparticle layer 20 down to the substrate 24, and therefore, to form the bridge supports. The second dosage 30 is of a radiation dosage lower than that of the first dosage 28. The lower, second dosage of radiation is only able to penetrate and aggregate half of the nanoparticle layer 20. The non-aggregated nanoparticles in the lower half of the nanoparticle layer, beneath the region 36, can then be removed to reveal the three-dimensional suspended bridge structure 32.

Figure 6:
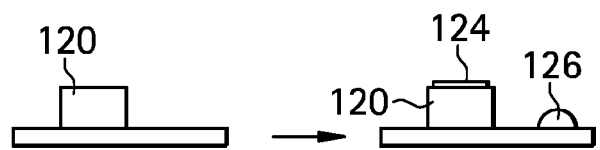
FIG. 6 schematically illustrates formation of a complex three-dimensional structure.

Sequential structure formation can also be used to generate complex three-dimensional structures, including multilayer structures. For example, as shown in FIG. 6, a first three-dimensional structure 120 is formed on a substrate 122 from a first layer of nanoparticles. After removal of the non-aggregated nanoparticles to provide the first structure 120, an additional structure 124 is formed from a second layer of nanoparticles. The second layer of nanoparticles can be the same or different as the first layer. The additional structure 124 can be associated with the first structure 120. Alternatively, or in addition, structure 126 is formed remote from the first structure 120. The multiple additional structures 124, 126 can be formed from the second layer simultaneously or sequentially. The sequential process can be repeated as many times as is desired to produce the final structure.

Figure 7:
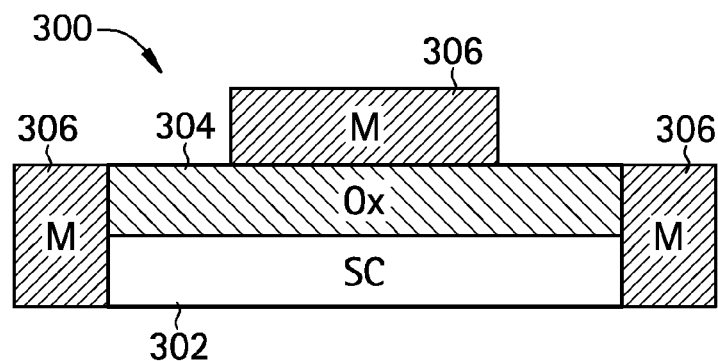
FIG. 7 illustrates an exemplary application of the directly written patterned structures, in this figure a transistor.

FIG. 7 illustrates a specific example of a complex, multi-layer structure fabricated using sequential direct writing with incident radiation. FIG. 7 is a cross-sectional perspective view of a transistor 300. The transistor 300 has a semiconducting layer 302. On top of the semiconducting layer 302 is a metal oxide layer 304. Metal electrodes 306 are disposed on the ends of both the semiconducting and the metal oxide layers 302, 304, and on top of the metal oxide nanoparticle layer 304 to complete the transistor. One or all of the illustrated components can be formed from a nanoparticle layer as described herein. In one embodiment, the semiconducting layer 302 is first generated from a first nanoparticle layer as described herein, followed by forming the metal oxide layer 304 from a second nanoparticle layer as described herein. Accordingly, a method of manufacture of an article comprising a plurality of aggregated nanoparticle layers comprises forming a layer comprising a plurality of nanoparticles on a surface; exposing a portion of the layer to incident radiation in a defined pattern at a dosage effective to aggregate the nanoparticles in the exposed portion of the layer into a three-dimensional structure, wherein the three dimensional structure has a shape defined by the dosage, location, and pattern of the radiation; and repeating these steps until a multi-layer article of desired thickness is obtained. In any one of these steps, unexposed portions of each nanoparticle layer can be removed.

Another specific example of a complex, multilayer structure fabricated using sequential direct writing with incident radiation is a giant magnetoresistive (GMR) device. A GMR device comprises two or more ferromagnetic layers separated by a non-ferromagnetic spacer having a thickness of about 1 nm, for example. An exemplary GMR device comprises Fe/Cr/Fe, i.e., a chromium or chromium-containing layer sandwiched between two iron or iron-containing layers.

One are all of the layers in a GMR device can be formed using the methods described herein, by coating a layer of nanoparticles onto a surface, direct writing with incident radiation, and removing the unexposed portion. For example, in one embodiment, a first ferromagnetic layer is generated from a first nanoparticles layer by coating and direct writing with incident radiation; forming a non-ferromagnetic spacer layer from a second nanoparticles layer on the first layer by coating and direct writing; followed in turn by forming a second ferromagnetic layer from a third nanoparticles layer on the non-ferromagnetic spacer layer by coating and direct writing.

This method can be used to form a variety of GMR devices. A spin valve is one of the most industrially useful GMR devices. In a spin valve, there is no RKKY coupling. The two or more conducting ferromagnetic layers alternate in electrical resistance depending on the alignment of the ferromagnetic layers. The layers align "up" or "down", the two available electron spin states, depending on the external magnetic field. When the magnetization vectors of the ferromagnetic layers are aligned (both "up" or both "down"), their electrical resistance will be lower (so a higher current flows at constant voltage) than if the ferromagnetic layers are anti-aligned (one "up" and one "down"). The ferromagnetic layers are composed of, for example NiFe (permalloy), and the spacer is composed of Cu. Spin valves are used in magnetic sensors and hard disk read heads.

Another type of GMR device that can be manufactured using the methods described herein uses tunnel magnetoresistance (TMR), in which electric current-perpendicular to plane (CPP) transport is achieved by using quantum mechanical tunneling of electrons through the thin insulator layer separating ferromagnetic layers. Still another type of device utilizes spin torque transfer, in which a current of spin-polarized electrons is used to control the magnetization direction of ferromagnetic electrodes in the device. In addition to magnetic sensors and hard disk read heads, GMR devices have potential application in magnetoresistive random access memory (MRAM). MRAM is a type of non-volatile semiconductor memory system wherein information is stored even when power is turned off (unlike charge-based DRAM in current use). MRAM accordingly potentially provides instant-on computing. MRAM uses arrays of TMR or spin torque transfer devices.

Figure 8:
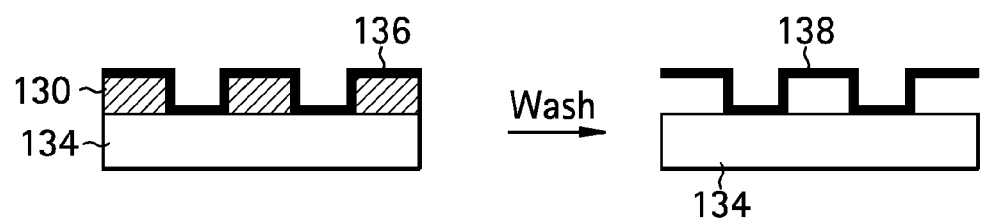
FIG. 8 illustrates an exemplary process for the formation of a three-dimensional structure on a predefined three-dimensional template.

In another aspect, a three-dimensional structure is generated using a three-dimensional template. In a specific embodiment, the three-dimensional template is subsequently removable, as shown in FIG. 8. In FIG. 8, a three-dimensional template 130 is disposed on a substrate 134. A conformal nanoparticle layer 136 is then deposited onto the template and substrate, and all or a portion of the nanoparticle layer is exposed to incident radiation at a dosage effective to aggregate the nanoparticles in the shape of the template 130.

After structure formation, non-aggregated nanoparticles can then be removed, to provide the three dimensional layer disposed on the template. Where the template itself is also removable, both the non-aggregated nanoparticles and the template are removed to yield the three-dimensional structure 138 disposed on the substrate 134. The order of removal is not critical. In one embodiment, the non-aggregated particles and the template are removed essentially simultaneously. The structures formed using a template can be subjected to subsequent structure generation cycles as described above. In another embodiment, it is also possible to remove only the non-aggregated nanoparticles, leaving behind the template 130 and the three-dimensional structure 138. A new layer of nanoparticles can be applied and then a second three-dimensional structure (not shown) can be formed, near or on the first three-dimensional structure 138. The second structure can be conformal or non-conformal to the template 130 and can comprise the same material or a different material than the first nanoparticle layer 136.

Figure 9:
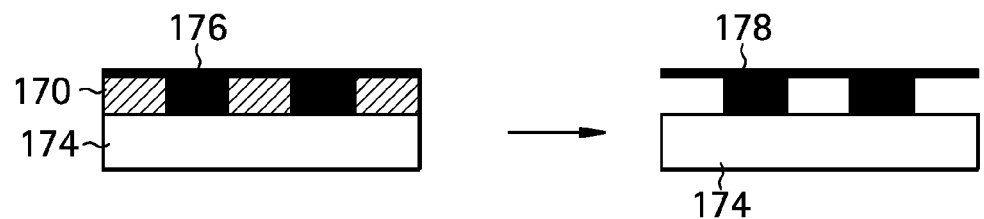
FIG. 9 illustrates another exemplary process for the formation of a three-dimensional structure on a predefined three-dimensional template.

In another embodiment, a non-conformal nanoparticle layer can be deposited on a three-dimensional template to generate a three-dimensional structure. In FIG. 9, a three-dimensional template 170 is disposed on a substrate 174. The non-conformal nanoparticle layer 176 is then deposited onto the template and substrate, and all or a portion of the nanoparticle layer is exposed to incident radiation at a dosage effective to aggregate the nanoparticles in the shape of the template 170. Unlike the conformal nanoparticle layer 136 of FIG. 8, which can have a substantially uniform thickness conforming to the template, the non-conformal layer 176 can have areas of varying thickness, filling the voids of the template and forming a substantially flat top surface. The location and dosage of the radiation used to aggregate the particles can be adjusted so as to aggregate the particles in both the thinner and thicker regions, i.e., the thicker layers located in the voids can be exposed to a higher dosage effective to aggregate the entirety of the thicker layer, and the relatively thinner portion of the layer can be exposed to a lower dosage effective to aggregate the thinner layer. Alternatively, the entire layer can be exposed to a uniformly high dosage effective to aggregate both the entirety of the thicker and the thinner portions of the layer, provided that exposure to the higher dosage does not significantly adversely impact the thinner portion of the layer. After removal of the template 170 and any non-aggregated nanoparticles, the remaining three-dimensional structure 178 will have a base that conforms to the original template and the top will be flat.

Figure 10:
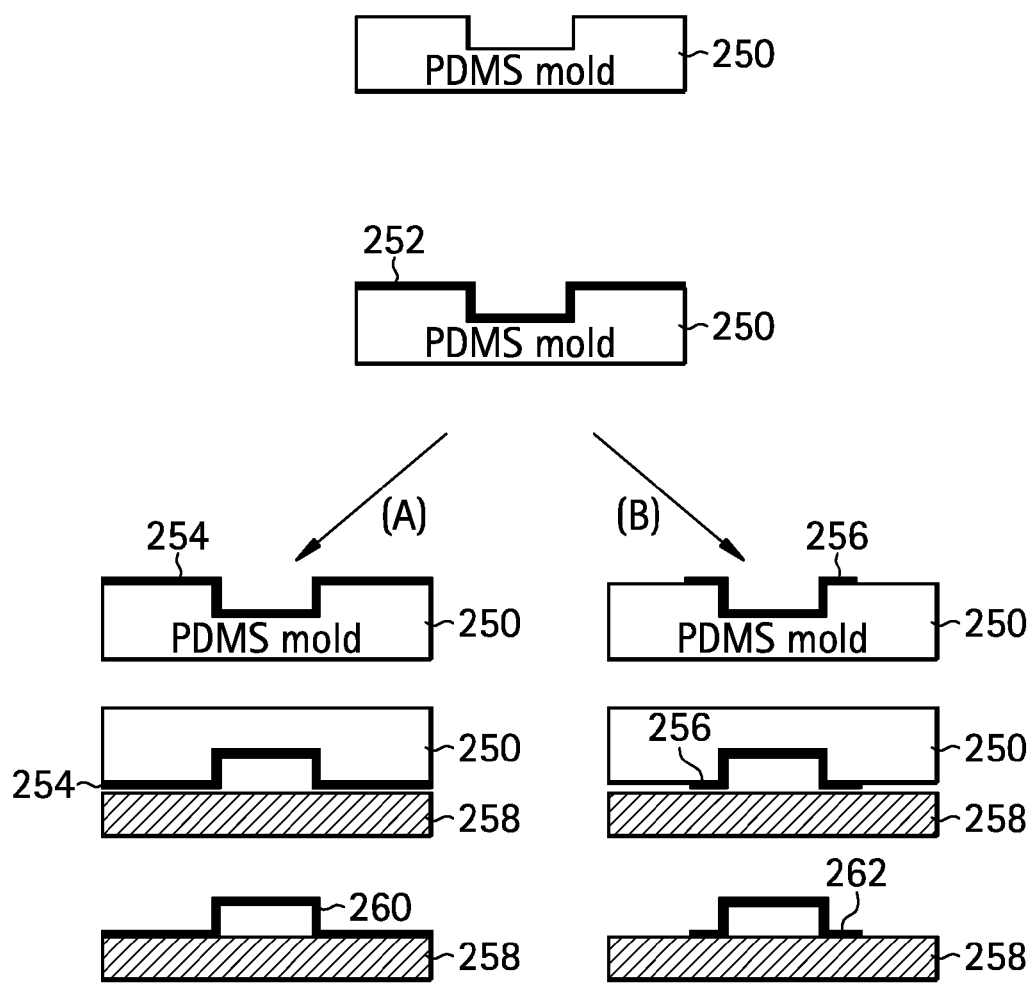
FIG. 10 illustrates an exemplary method of using a mold to generate a three-dimensional structure, followed by transfer printing of the structure onto a substrate.

The template used to form the three-dimensional structure can be in the form of a mold. Use of a mold is advantageous for very complex structures, for example structures having an irregular shape, or where it is desirable to transfer the structure to a substrate that is not suitable for structure formation. As illustrated in FIG. 10, mold 250 provides a template for creating a structure. A nanoparticle layer 252 is formed on the mold. The nanoparticle layer 252 can be aggregated by one of two methods. As shown in (A), the entire nanoparticle layer 252 is exposed to high-dose radiation to form a completely aggregated nanoparticle layer 254. Alternatively, as shown in (B), the nanoparticle layer 252 is selectively exposed to incident radiation to form a discrete structure 256, and the non-aggregated nanoparticle layer removed from the substrate 250. The layer structure 254 or the patterned structure 256 can then be applied to a substrate 258 by a transfer printing process. In a transfer printing process, the mold 250 is flipped upside down so that structures are disposed between the mold 250 and the substrate 258. The mold can then be removed physically, by peeling off the mold, or chemically, for example dissolved in solution to release the structural elements from the mold. In either case, a freestanding nanoparticle structure 260 or 262 is left on the substrate 258. In another embodiment, nano-scaled ferromagnetic (FM) ring structures can be generated by the direct write process described herein on, for example, magnetic $Fe_3O_4$ nanoparticle films. Such rings can be used as binary memory elements by retaining magnetization in either a clockwise (CW) or counterclockwise (CCW) orientation within the circumference of the ring. "Nano-scaled" as used in this context means rings have a diameter of about 50 nm to about 10,000 nm.

The use of ring structures in magnetic applications has been known in the art for decades. "Ring core" memory on the micrometer-scaled scale was one of the earliest forms of magnetic data storage. Nano-scaled ferromagnetic rings offer many new technological advances including potential use in binary data storage due to the two possible states of clockwise or counterclockwise vortex magnetization. The circular vortex states form magnetic flux closure without magnetic poles or stray fields, and lead to high degree of magnetic stability and small interaction (crosstalk) between the neighboring rings. This makes the nano-scaled ferromagnetic ring array described herein a promising candidate for application to magnetoresitive random access memory (MRAM).

It is particularly desirable to obtain predictable distinct circulation of the vortex states for the MRAM applications. Due to energy and geometry degeneracy, the two vortex states for a symmetric nanoscopic FM ring—CW and CCW states—are non distinguishable from the magnetization measurement and can happen in equal probability during the switching procedure. This uncertainty of getting CW or CCW vortex states with equal probability is not desired in a real data storage application where "programming" a specific state for data encoding is desired. Pinning the vortex chirality by biasing one of the circulation patterns of the domain walls in an asymmetric FM nanoring has been proposed, for example in E. Saitoh, "Manipulation of vortex circulation in decentered ferromagnetic nanorings", J. App. Phys. 95, 1986 (2004).

In another aspect, a method of making a nanocomposite is disclosed. Any of the foregoing methods can be used, including forming the layer(s) on a template. In one embodiment, to form a nanocomposite, a first layer is formed, comprising a plurality of nanoparticles on a substrate. A portion of the layer is exposed to incident radiation having a defined pattern at a dosage effective to aggregate the nanoparticles in the exposed portion of the layer into an array of individual particles with a shape and size defined by the dosage, location, and pattern of the incident radiation. (Alternatively, a template can be used, as described above). The unexposed portion of the layer is then removed, and a second layer comprising a second plurality of nanoparticles is formed. The second layer fills the spaces between the individual particles. The second layer is then exposed to radiation to aggregate the second plurality of nanoparticles to form a continuous phase of aggregated nanoparticles surrounding the array of individual particles.

A specific example is the preparation of nanocomposite exchange-spring magnets. An exchange-spring magnet comprises a hard magnetic material and a soft magnetic material in direct contact with each other. The hard magnetic material exhibits high coercivity, and the soft magnetic material has low coercivity, but provides a high saturation magnetization. The two phases are coupled via interfacial exchange interaction such that the soft phase becomes "hardened" and its high magnetization enhances the energy product ($BH_{max}$) of the composite. An anisotropic exchange spring magnet can be used in electric motors, magnetic field sensors, rotation sensors, acceleration sensors, and torque sensors.

In one example of an exchange spring magnet, grains of hard magnetic material are dispersed in a solid matrix of soft magnetic material. Suitable hard and soft magnetic materials for this application are described in FIG. 14 of U.S. Pat. No. 7,344,605. In one embodiment the method of forming the exchange spring magnet comprises forming a layer comprising a plurality of hard magnetic nanoparticles on a substrate; exposing a portion of the layer to incident radiation having a defined pattern at a dosage effective to aggregate the nanoparticles in the exposed portion of the layer into an array of individual particles with a shape and size defined by the dosage, location and pattern of the incident radiation, and adhered to the substrate; and removal of the unexposed portion. A layer comprising a plurality of soft magnetic nanoparticles is formed filling the spaces between the hard magnetic particles, and exposed to radiation to aggregate the soft magnetic particles so that a continuous soft magnetic phase surrounds the hard magnetic particles. The formation of hard magnetic particles and a soft magnetic matrix surrounding the particles can be repeated until an exchange spring magnet of desired thickness is obtained.

In any of the foregoing methods, the fabricated structures can be an array of particles on the substrate surface. The particles can be removed from the substrate surface, by etching or dissolving the surface, for example, to achieve free-standing particles with specific sizes and shapes defined by the original writing process. These free-standing particles can be further functionalized using many different types of organic and inorganic materials, including one or more of the following: small molecules such as dyes, metabolites, and active pharmaceutical agents; nanosized materials such as nanoparticles, nanocrystals, nanotubes, nanowires and the like; and polymers, including biomacromoleucles such as enzymes, antibodies, antigens, polypeptides, proteins, carbohydrates, oligonucleotides, and polynucleotides such as DNA, RNA, siRNA, and the like. This process is illustrated in FIG. 11. Functionalization can be by coating the free-standing particles or covalent reaction (directly, or using one or more linkers) with the functionalization agent.

Further in any of the foregoing embodiments, it is contemplated that the method can be used in combination with a mask to convert the process from a serial writing mode to a parallel writing mode. A mask can be created that permits exposure of the nanoparticle layer in areas appropriate to generate the desired structure geometry, while covering the remaining areas to prevent exposure and, therefore, aggregation. A mask (or multiple masks) can be placed over one or more substrates, templates, or molds having a nanoparticle layer formed thereon. The nanoparticle layer is then exposed to incident radiation through the applied mask or masks. This method enables multiple structures to be directly written at once.

A variety of process steps and materials can be used in the practice of the methods described herein. In one embodiment, the method includes forming the layer comprising a plurality of nanoparticles on a surface of a substrate, a template, or a mold. The layer can be formed by a variety of methods, for example powder coating or solution coating, including electrophoretic methods and Langmuir-Blodgett methods. In one embodiment a solution comprising the nanoparticles are coated on the surface to form a film via methods such as spray coating, spin coating, dip coating, drop casting, and the like. In another embodiment, layer-by-layer assembly from a solution comprising the nanoparticles is used to form the film. As is known in the art, layer-by-layer assembly is based on electrostatic attraction or charge transfer complexation between the nanoparticles.

Nanoparticles suitable for use in forming the nanoparticle layer aggregate upon exposure to high-dose radiation. Suitable nanoparticles comprise metals of groups 4, 5, 6, 7, 8, 9, 10, 11, or 12 of the Periodic Table. The metals can be elemental, or in the form of the corresponding oxide, sulfide, selenide, and the like. Combinations of the metals can be used, including metal alloys and mixed metal oxides, sulfides, selenides, nitrides, and the like. In one embodiment the nanoparticles comprise a semiconductor, a single molecule magnet, a polynuclear metal carbonyl cluster, a GeSbTe chalcogenide alloy (GST), a piezoelectric material, and the like.

Specific exemplary semiconductor nanoparticles comprise material containing a metal from periods IV-VI of the Periodic Table (e.g., ZnO, ZnS, ZnSe, ZnTe, CdS, CdSe, CdTe, HgS, HgSe, HgTe) and periods III-IV (e.g., AlP, AlAs, AlSb, GaP, GaAs, GASb, InP, InAs, InSb), certain nitrides (e.g., AlN, GaN, InN), and the like. Suitable piezoelectric nanoparticles can comprise, without limitation, $BaTiO_3$, $SrTiO_3$, $Pb[Zr_xTi_{1-x}]O_3$ where $0<x<1$, $Pb_{0.83}La_{0.17}(Zr_{0.3}Ti_{0.7})_{0.9575}O_3$, $KNbO_3$, $LiTaO_3$, $Na_xWO_3$, $Ba_2NaNb_5O_5$, $Pb_2KNb_5O_{15}$, $AlPO_4$, $GaPO_4$, and the like. In one embodiment, an aggregated one-, two-, or three-dimensional structure comprising metal selenides, semiconductors, single molecule magnets, or piezoelectrics is within the scope of the present invention, as it is believed that use of these materials in a lithographic writing process has not heretofore been disclosed.

The nanoparticles have an average largest dimension of about 0.1 to about 500 nanometers, specifically 0.3 to 200 nanometers (nm). Nanoparticles having a narrow particle size distribution allow the formation of more precise structures. For example, the nanoparticles can have $D_{90}$ of 0.1 to 500 nm, specifically a $D_{90}$ of 0.2 to 200 nm, more specifically a $D_{90}$ of 0.3 to 100 nm, even more specifically a $D_{90}$ of 0.4 to 50 nm, still more specifically $D_{90}$ of 0.5 to 10 nm. As used herein "$D_{90}$" means that 90% or more of the particles fall within the specified range.

Solution coating as used herein refers to methods wherein the nanoparticles are dissolved and/or suspended in medium that is liquid at the coating temperature. Nanoparticulate metal powders, for example, are typically insoluble and not readily dispersible in common solvents, but can be solubilized and/or dispersed when in the form of stabilized metal clusters or metal colloids, as is known in the art. Stabilization of the clusters prevents the undesired agglomeration of the metal nanoparticles. A number of methods have been described for the preparation of stabilized metal and bimetallic clusters having a relatively narrow size distribution in the nanometer range. Ligand-bridged or ligand-complexed molecules having clearly defined stoichiometric compositions (so-called cluster complexes), such as metal carbonyl clusters or metal clusters with bridging main group elements can also be used.

Ligands that can be useful in the stabilization of the metal clusters include thiols, phosphates, phosphine oxides, amines, pyridines, carboxylic acids, cyanates, thiocarbamates, alcohols, phosphanes, phenanthroline derivatives, inorganic complexes (e.g., polyhedral oligomeric silsesquioxanes (POSS)), mixtures comprising at least one of the foregoing, and the like. Polymers can also be used, such as polyvinylpyrrolidone. Tetraalkylammonium and phosphonium salts of the formula $R_4N^+X^-$ or $R_4P^+X^-$, can be used, wherein each R is the same or different, and has 1 to 36 carbon atoms. Suitable salts are described in EP-A-0 672 765 and PCT WO 92/18246, and include Tetrabutyl- or tetraoctylammonium chloride, bromide, or acetate. The metals may also be any of a wide variety; thus, for example, the metals and metal alloys described in Patent Applications EP-A-0 672 765 and PCT WO 92/18246 can be used. Specific metals in the form of $R_4N^+X^-$ or $R_4P^+X^-$ stabilized clusters include Ti, Mo, Fe, Ru, Co, Rh, Ni, Pd, Pt, Cu, Ag, and Au. Specific bimetallic combinations include Pd/Pt, Pt/Sn, Pd/Cu, Pd/Ni, and Fe/Co.

Suitable solvents will be effective to dissolve and/or disperse the nanoparticles. Preferably, the solvent is readily removed before or after formation of the structure. The solvents include those commonly used in chemistry and are readily determined by one of ordinary skill in the art without undue experimentation. Exemplary solvents include tetrahydrofuran (THF), toluene, acetone, dimethylformamide (DMF), ethanol, water, and the like.

The concentration of the nanoparticles in the coating solution is not critical, and is selected so as to allow good solution and/or dispersion and acceptable coating characteristics, e.g., viscosity. The concentration can thus vary widely, from 1 to 99 wt. %, specifically 10 to 80 wt. %, for example.

The nanoparticle layer is formed on the substrate with a thickness that enables the creation of structures in one, two, or three dimensions. When a three-dimensional structure is desired, it can be advantageous to have a nanoparticle layer that is thicker than the layer that would be required for one- or two-dimensional structures. The thickness of the nanoparticle layer can be about 10 nm to about 3000 nm specifically about 30 nm to about 1000 nm, more specifically about 30 nm to about 300 nm. In general, for two dimensional structures, the nanoparticle layer can be less than or equal to about 100 nm of layer, but for three dimensional structures, a thicker film is needed and can be greater than about 100 nm. It is to be understood that when the nanoparticle layer is on a substrate (rather than a three-dimensional template), the height of the three-dimensional structure is controlled by both the dosage of the impinging radiation and the thickness of the layer.

Other components can be present in the layer to provide desired characteristics to the layer and/or article, provided that such components do not significantly to adversely affect the formation of the structures.

Various materials can serve to provide a surface on which to coat the nanoparticles, including both organic and inorganic materials. The choice of substrate or permanent template is often dictated by the intended use of the nanoparticles. In one embodiment the substrate is a Si or GaAs wafer or metal oxide material (e.g., $SnO_2$). Other examples of substrate materials can include, without limitation, silicon on insulator (SOI), SiC, ZnO, CdSe, GaN, and the like. The choice of removable template or mold materials is usually dictated by the need to readily remove the template or mold without adversely affecting the generated structure. As mentioned above, photo-resist materials can be used as a removable template, for example materials such as polymethylmethacrylate/photo-resist (PMMA/PR) structures. Polydimethylsiloxane (PDMS) is an exemplary material that can be used for molds.

A variety of post-structure generation procedures can be used in the present method. Removal of the non-aggregated nanoparticles can be by physical or chemical means, for example abrasion, washing, etching, or dissolution. In one embodiment the non-aggregated particles are removed by washing with the same solvent used in the layer-forming solution.

One embodiment comprising selectively removing a portion of the three-dimensional structure to provide a porous three-dimensional structure. This is most readily accomplished where a combination of at least two different types of nanoparticles is used to form the layer, wherein the two different types have differing solubilities, for example. Thus, in one embodiment, the plurality of nanoparticles comprises a combination of a first nanoparticle composition and a second nanoparticle composition. After the three-dimensional structure is formed, at least a portion of the aggregated nanoparticles comprising the first composition is selectively removed from the three-dimensional structure to provide a porous three-dimensional structure comprising aggregated particles of the second nanoparticle composition.

Other post-structure generation procedures include transfer printing the three-dimensional structure onto a substrate;

The structures can be annealed to increase the stability of the structure or to induce a change in crystal structure. As an example, changing the crystal structure of iron-platinum nanoparticles from face centered cubic crystalline structure to face centered triagonal crystalline structure changes the effective magnetic feature of the material from superparamagnetic to ferromagnetic. Effective annealing conditions will depend on the particular nanoparticles used, and are selected so as to not significantly adversely affect the generated structure. Exemplary conditions include heating, for example at 100° C. to 900° C., specifically at 150° C. to 600° C. This treatment may be performed with or without a flow of gas, for example an inert gas or $H_2$.

In any of the above-described embodiments, using a mixture of nanoparticle materials rather than a single type can generate porous structures. In this embodiment, the mixture of nanoparticles is selected so as to provide aggregated materials of differing characteristics, for example solubility or hardness. After the structure is generated, an additional process step is used to selectively remove one of the types of aggregated nanoparticle from the structure. Where the particle types differ in solubility, the more soluble aggregated particle can be removed by etching or dissolving with an appropriate solvent, leaving behind a porous structure. Where the particle types differ in hardness, the softer aggregate can be removed by mechanical means, for example sand blasting.

The process as described herein provides an alternative to current lithography techniques by reducing the number of steps in the fabrication process, and by providing access to two-dimensional and three-dimensional systems. The process is suitable for applications that use one, two, and/or three-dimensional patterned materials of metal, semiconductor, magnetic, and insulator materials.

Exemplary applications for the generated structures include, without limitation, magnetic applications, photonic/plasmonic applications, electronics, sensors, microelectromechanicals (MEMs), nanoelectromechanicals (NEMs), and the like. Examples of magnetic applications include patterned media for hard disk drives (HDD), hard magnetic materials for motors and generators, spring-exchange materials, patterned soft magnetic material for radiofrequency (RF)/micro electronics, and the like. Examples of photonic/plasmonic applications include near infrared (NIR) materials, negative refractive index applications, plasmonic waveguides, horns, devices (e.g., cylinders, dots, wires, rings, split rings, holes, and the like), polarizers, filters, and the like. Examples of electronic applications include, without limitation, radiofrequency MEMs and NEMs actuators and sensors (e.g., inductors, switches, antennas, resonators, transmission lines, actuators, valves, hall voltage sensors, tunneling magnetometers, and the like), radio frequency identification (RFID) tags, and the like. Another possible application includes cantilevers for atomic force microscopes.

In a specific embodiment, the direct incident beam lithography method can be used to produce etching masks to pattern an underlying substrate, for example Si or $SiO_2$. After patterning of the underlying substrate, the mask can be removed by another etching/dissolution process. In still another specific embodiment, the direct incident beam lithography method can be used to produce masters for the preparation of molds and stamps for nanoimprint lithography, and microcontact printing, respectively.

In these various applications a variety of three-dimensional geometries are useful. For example, in photonic/plasmonic applications, a variety of structures placed on transparent or opaque substrates are useful for manipulating light or plasma, for example dots, symmetric and asymmetric rings, bull's eye patterns, crosses, and L-shapes. All of these structures can be made by method of this invention by appropriate variation of the location, pattern, and dosage of the incident radiation exposure. Plasma is used herein refers to an ionized gas, in which a certain proportion of electrons are free, rather than being bound to an atom or molecule.

The invention is further illustrated by the following non-limiting examples.

EXAMPLES

Example 1

This example was conducted to demonstrate the ability to pattern nanoparticle films in a single step. Patterning of magnetic $Fe_3O_4$ nanoparticle film on a silicon substrate was done using electron beam lithography (EBL) in the method disclosed above.

The $Fe_3O_4$ nanoparticles were first prepared by the following method. $Fe(acac)_3$ (acac=acetylacetonate) (2 millimoles (mmol)), 1,2-hexadecanediol (10 mmol), oleic acid (6 mmol), and oleylamine (6 mmol), were dissolved in 20 milliliters (mL) of benzyl ether and heated to 200° C. in nitrogen atmosphere. The flow of nitrogen was maintained throughout the reaction. The temperature of the resulting solution was maintained for 2 hours at 200° C. and was heated further to reflux (300° C.) for 1 hour. The solution was then allowed to cool down to room temperature and the nitrogen flow was disconnected. The solution had a substantially black color and then was precipitated by adding ethanol and separated via centrifugation. The precipitate was then dispersed in toluene at a final concentration of approximately 50 mg/mL.

The precipitate solution was then formed into a film layer. The nanoparticles were spin coated from toluene on clean silicon substrates at 3000 rpm to produce 40 nm thick films. Electron beam patterning of the nanoparticle film was done in two exposure modes—a continuous mode and a point exposure mode. In the continuous mode, the electron beam exposed a certain area of the film as a filled polygon pattern, and reacted, i.e., aggregated the nanoparticles in all of the area exposed within the pattern. An exposure test was performed in order to address dosage issues. The electron dosage was varied in the continuous mode from 25 microcoulombs per square centimeters (microcoulombs/$cm^2$) to 10000 microcoulombs/$cm^2$, while pattern size was changed from 10 square micrometers ($\mu m^2$) to 500 square nanometers ($nm^2$). The radiation was applied for a time effective to form the 50 nm dots. The time effective can vary from about 0.1 seconds to greater than about 10 seconds. In the point exposure mode, the electron beam was only allowed to expose one single point on the film and then moved to another adjacent point, without overlapping of the effective exposed area of the neighboring points.

Figure 12:
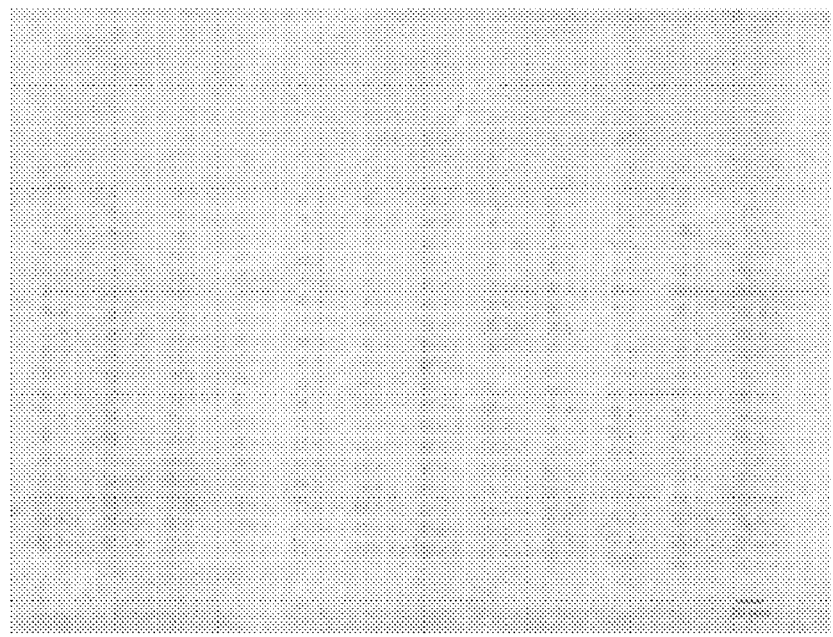
FIG. 12 is a test pattern written in $Fe_3O_4$ nanoparticle film showing the effect varying dosage on the geometry of the structures.
Figure 13:
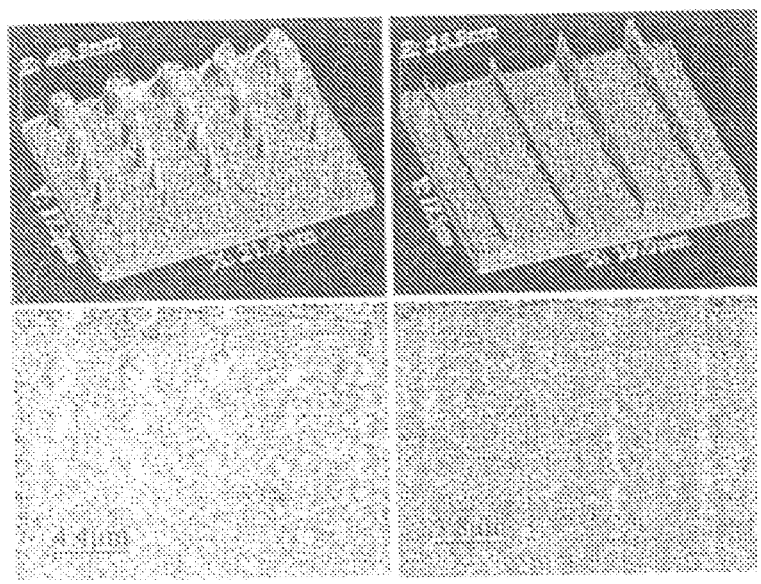
FIG. 13 shows atomic force micrograph and magnetic force micrograph images of $Fe_3O_4$ geometric patterns, in this embodiment dot arrays and lines of various widths.
Figure 14:
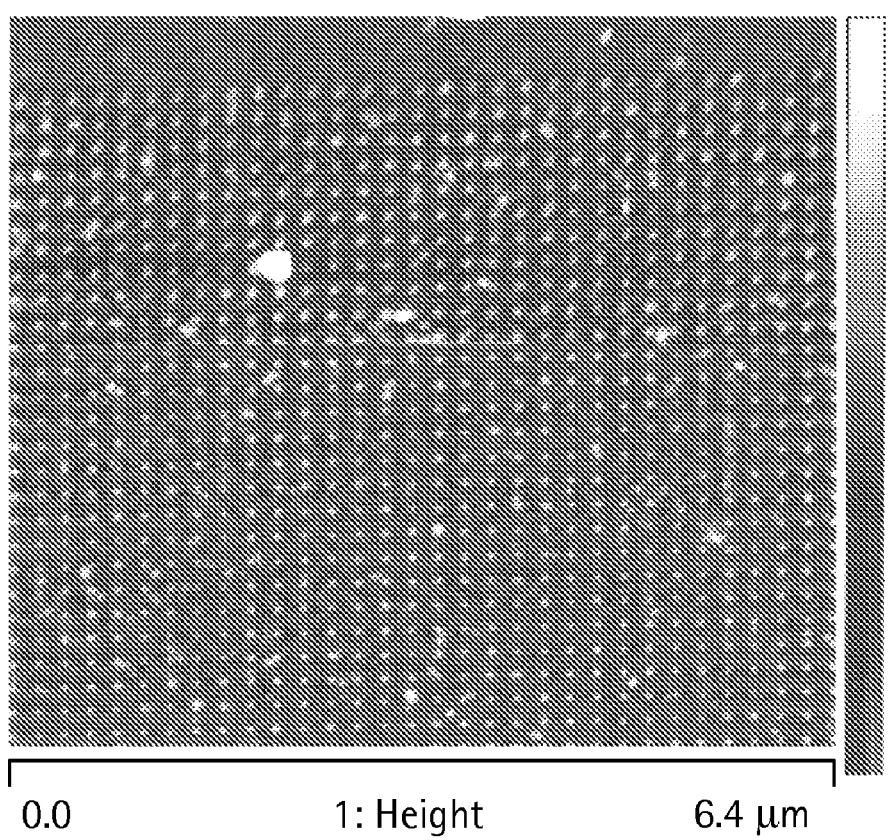
FIG. 14 shows an atomic force microscopy image of an array of dots made from aggregated $Fe_3O_4$ nanoparticles written in a point exposure mode.

FIG. 12 is an image of a patterned $Fe_3O_4$ nanoparticle film showing a dosage test of the electron beam writing method. The figure illustrates the minimal dosage required for writing the geometric patterns into the nanoparticle layers, and the effect of varying dosage on the geometry of the structures. FIG. 13 shows atomic force microscopy (AFM) and magnetic force microscopy (MFM) micrograph images of the $Fe_3O_4$ geometric patterns, in this case dot arrays and lines of various widths. Finally, FIG. 14 shows an atomic force microscopy image of array of 50 nm dots made from the aggregated magnetic $Fe_3O_4$ nanoparticles that were written in the point exposure EBL mode.

Example 2

This example shows the three-dimensional structures of patterned $Fe_3O_4$ nanoparticle film based on electron beam patterning of $Fe_3O_4$ nanoparticles covering a predefined photoresist template.

First, electron beam patterning was conducted on the photoresist. A film of 600 nm polymethylmethacrylate was applied to a clean silicon wafer by spin coating a 7%, 950K polymethylmethacrylate anisole solution at 2000 rpm. The film was further baked on a hot plate at 180° C. for 90 seconds. A computer-aided design (CAD) software was used to define two 700 micrometer on 300 micrometer windows inside the polymethylmethacrylate that were spaced with a 65 µm wide polymethylmethacrylate band. After electron beam lithography of the windows, the sample was developed for 30 seconds in a 3 to 1 ethanol:methyl isobutyl ketone (MIBK) solution.

Next electron beam lithography was used to pattern the $Fe_3O_4$ suspended bridge structure. The patterned polymethylmethacrylate substrate was further spin coated with the $Fe_3O_4$ nanoparticles at 600 rpm to produce a conformal 100 nm thick layer. In the next step, three 18 µm wide, 400 µm long lines were written in a continuous radiation mode inside the nanoparticle layer. The radiation was run from one window to the second window, and then developed out by washing with hexane, ethanol, and acetone. The result was three three-dimensional suspended bridge structures of $Fe_3O_4$ nanoparticles.

Figure 15:
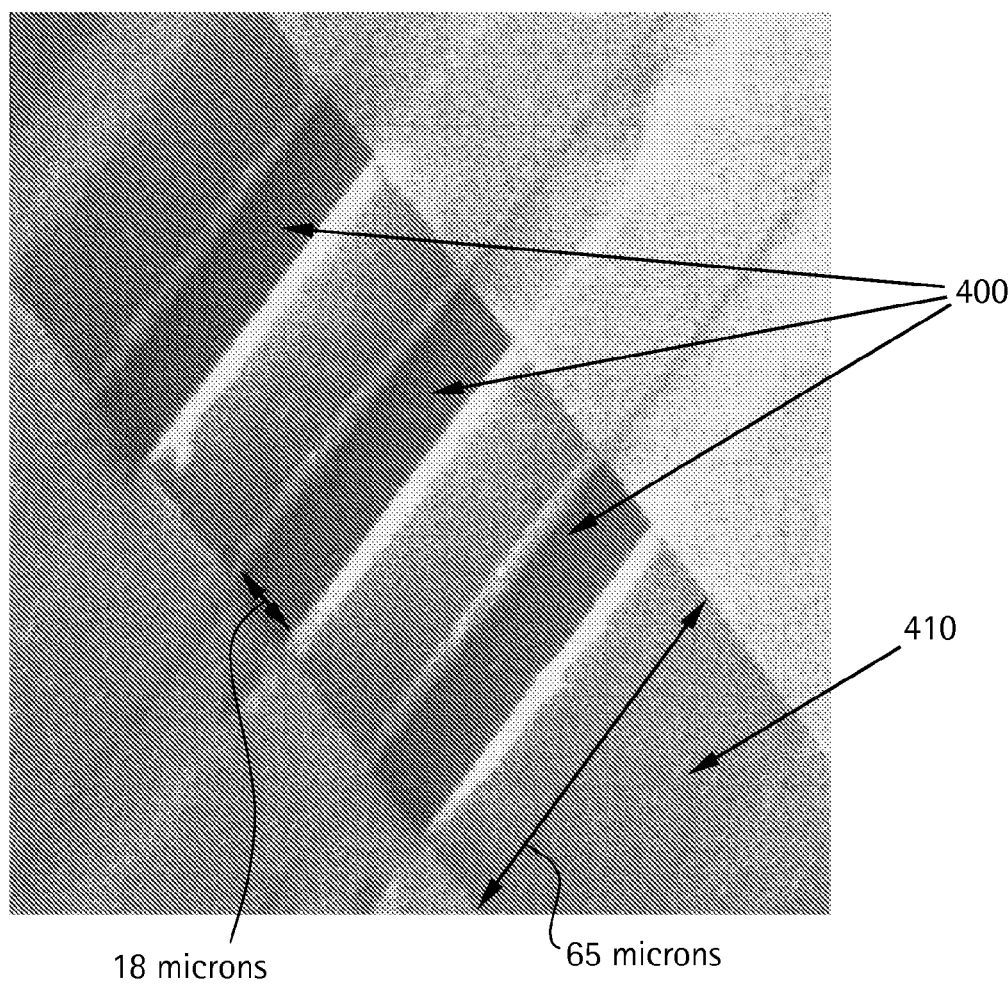
FIG. 15 shows a 45-degree angle scanning electron microscope image of a suspended $Fe_3O_4$ bridge fabricated using a template of a predefined photoresist structure.

FIG. 15 shows a 45-degree angle scanning electron microscopy image of the three 18 micrometers wide, 65 micrometers long $Fe_3O_4$ three-dimensional suspended bridge structures. The bridge structures are the dark bands illustrated by reference numeral 400. The lighter shaded band was the former location of the polymethylmethacrylate photoresist template that was patterned prior to being removed in the washing process (as shown by reference numeral 410).

Example 3

Figure 16A:
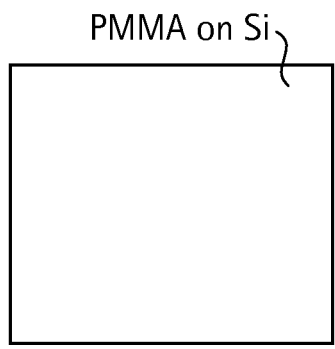
FIG. 16 shows a top view schematic of the stages of forming a pre-textured layer of PMMA by (a) spin coating and curing, (b) EBL, and (c) development.
Figure 16B:
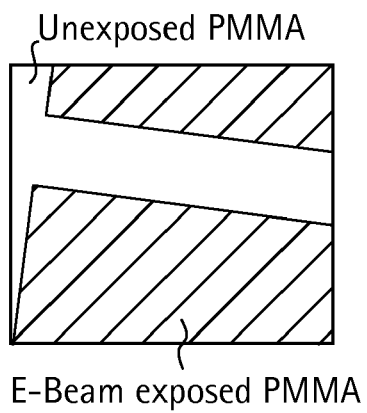
Figure 16C:
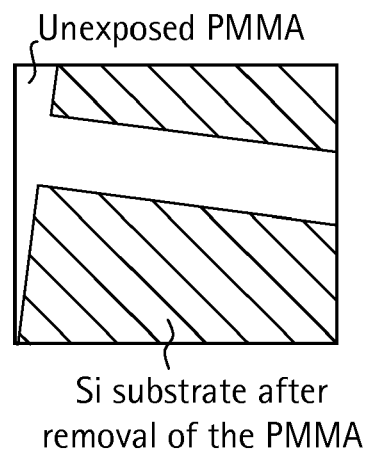

The pre-textured PMMA is prepared by EBL. First, 7% poly(methyl methacrylate) (PMMA) in anisole was spin coated at 4500 rpm for 90 seconds to form 200 nm thick PMMA film, followed by baking the sample for 30 minutes at 190° C. The film was then patterned by EBL using 200 µC/$cm^2$ at 20 keV electron acceleration voltage, followed by MIBK:Isopropyl alcohol (1:3) development to remove the exposed PMMA area completely, leaving behind a PMMA line of 150 microns wide. These processes and results are illustrated in the top-view schematic of FIG. 16. FIG. 16a represents a continuous PMMA film on a Si substrate. In FIG. 16b, a defined area (black in the schematic) of PMMA has been exposed by e-beam radiation to pattern the film. FIG. 16c depicts the patterned Si substrate after the exposed PMMA is removed by development.

Figure 17:
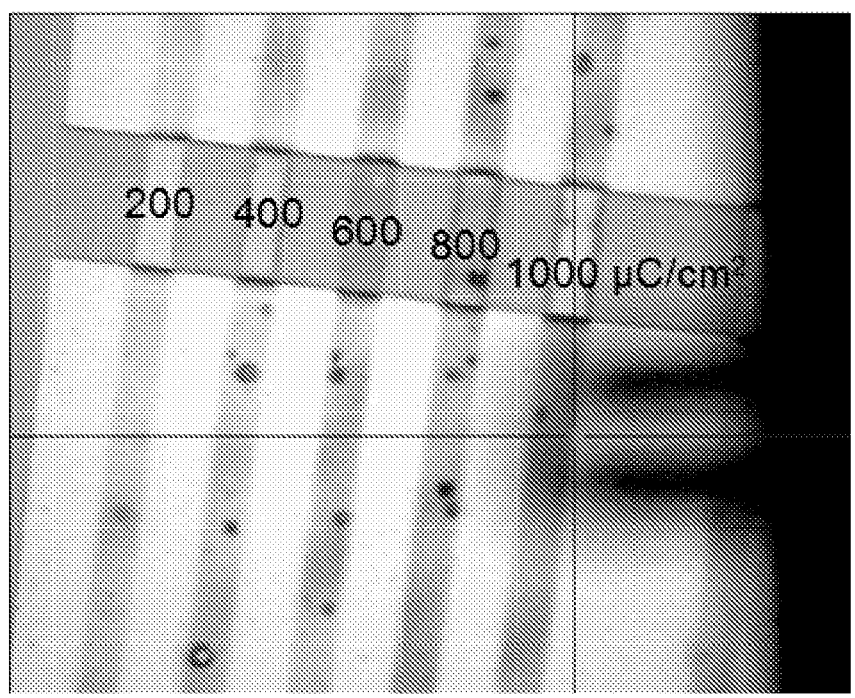
FIG. 17 is a microscopy image of nanoparticle bridges on a PMMA 3D topography.

Next, a 6-nm oleic acid coated $Fe_3O_4$ nanoparticle film was spin-coated at a speed of 1000 rpm out of toluene onto the pre-textured sample. The film was further patterned into stripes using a series of EBL dosages (200, 400, 600, 800, 1000 µC/$cm^2$) at 20 keV electron acceleration voltage. The unexposed nanoparticles film was removed by rinsing in toluene. FIG. 17 is a microscopy image of the resulting bridges of aggregated nanoparticles on the PMMA 3D topography. Due to the different EBL dosages for each bridge, they are of different thicknesses as indicated by the different shades of grey.

This example demonstrates the technology for writing a pattern of suspended bridges of aggregated nanoparticles of varying thicknesses on a pre-textured PMMA surface.

Example 4

Figure 18:
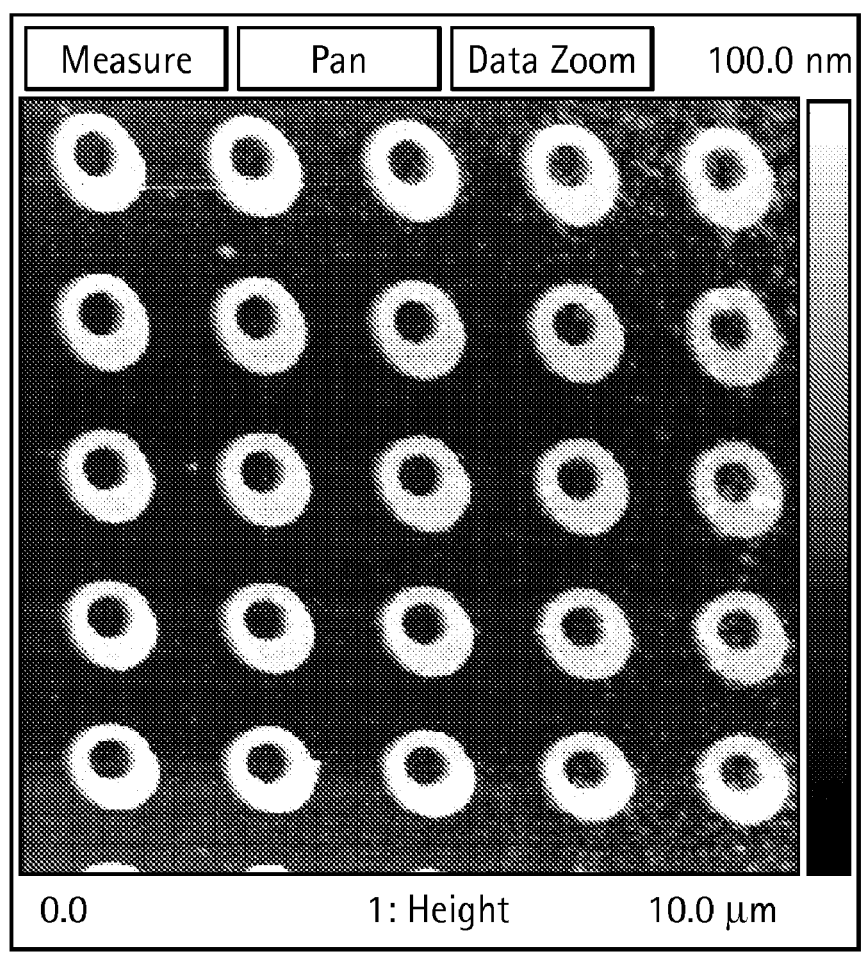
FIG. 18 is a microscopy image of the fabricated nanoscopic ferromagnetic $Fe_3O_4$ rings array obtained by spin coating, patterning with EBL, and development.

A plain silicon wafer was coated with $Fe_3O_4$ nanoparticles film. An original solution of oleic acid coated $Fe_3O_4$ nanoparticles was spin coated out of hexane at 1000 rpm for 60 seconds to form a 6-nm film. The as prepared film was then directly exposed to EBL with area exposure dosage of 400 $\mu C/cm^2$ at 20 keV electron acceleration voltage, writing asymmetric ring structures of 1 $\mu m$ wide (on the long axis). After the direct EBL patterning of the nanoscopic ring structures, the sample was rinsed with toluene to remove the unexposed nanoparticle film. The fabricated nanoscopic ferromagnetic $Fe_3O_4$ rings array obtained by this process are shown in FIG. 18. This example demonstrates the fabrication of asymmetric nanoscopic magnetic ring structures through direct write process in a magnetic $Fe_3O_4$ nanoparticle film.

Example 5

Materials: Cadmium oxide (99.99%), selenium powder (99.5%), trioctylphosphine oxide (TOPO, 90%), trioctylphosphine (TOP, 90%), and diethylzinc (1.0 M solution in hexane) were purchased from Aldrich. Bis(trimethylsilyl)sulfide (99.9%) was purchased from Fluka. Tetradecylphosphonic acid (TDPA) was purchased from PCI synthesis. Tetramethylammonium hydroxide pentahydrate (99%) was purchased from Acros while hexadecylamine (HDA, 90%) was purchased from Alfa Aesar. The chemicals were used as received unless specified.

Synthesis of CdSe: A Schlenk flask containing 0.0514 g (0.4 mmol) of cadmium oxide, 0.1116 g (0.4 mmol) of TDPA and 3.8744 g (10 mmol) of TOPO was heated to 340-350° C. under Ar flow for 3 hrs resulting in a colorless solution. The temperature of the solution was then reduced to 260° C. and a solution of selenium containing 0.0263 g (0.33 mmol) of selenium powder in 2 mL of TOP was injected. The resulting mixture was cooled down to 180° C. by lifting the reaction flask from the heating mantle. Then the temperature was raised slowly to 250° C. and the solution was digested at that temperature for 1-2 hours, depending on the required particle size. The resulting CdSe nanoparticles were purified by dispersing in hexane followed by precipitation with methanol three times.

Synthesis of Core-Shell CdSe—ZnS: The purified CdSe nanoparticles from above were dissolved in 5 mL of hexane and transferred to a Schlenk flask containing 5.0 g (13 mmol) TOPO and 1.5 g (6 mmol) HDA. The mixture was heated at 150° C. for 2 hrs under constant Ar flow. After complete evaporation of the hexane a stock solution of 1.6 mL of dimethylzinc and 0.28 mL of bis(trimethylsilyl)sulfide in 6 mL of TOP was added over 15 min. at 150° C. The reaction temperature was reduced to 100° C., and the mixture was digested for 1 hr at that temperature. The resulting core-shell CdSe—ZnS material was purified by dispersing the product in distilled dichloromethane followed by precipitation with n-butanol/methanol mixture three times.

Figure 19:
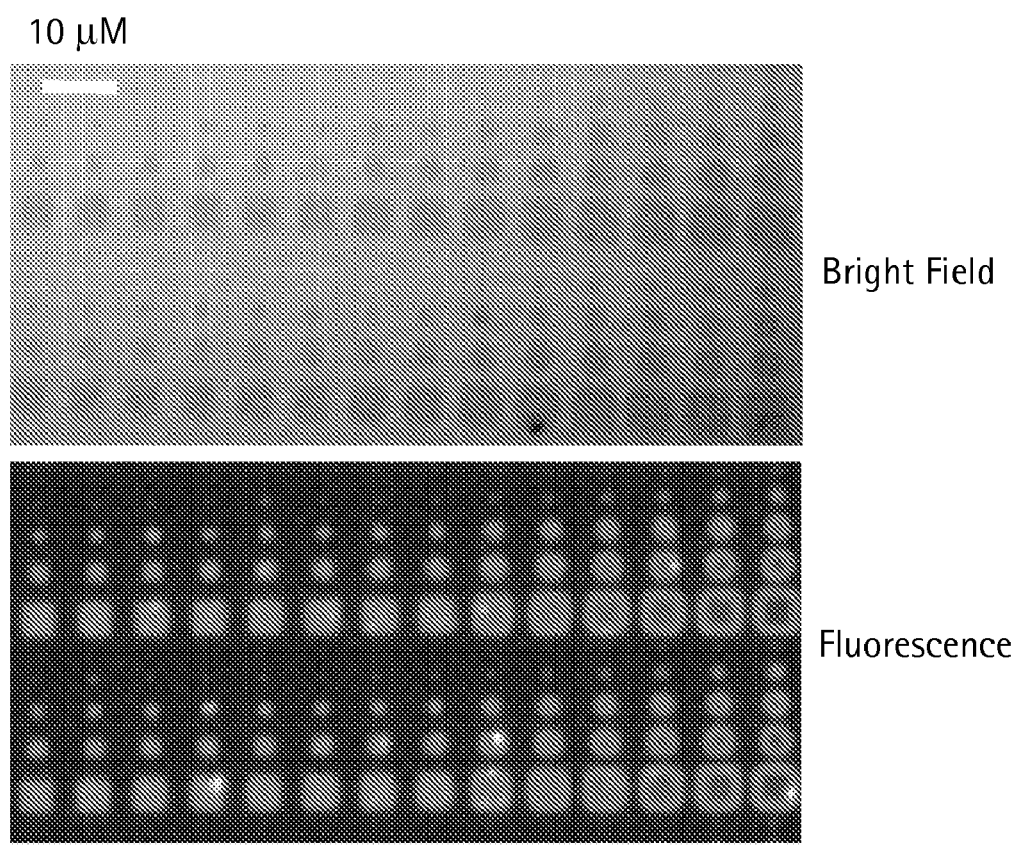
FIG. 19 shows bright field and fluorescence microscopy images of a variety of size structures from 500 nm wide to 5 micrometers wide obtained by the direct writing process on films of semiconducting CdSe—ZnS nanoparticles.

Direct EBL: A film of TOPO functionalized CdSe—ZnS QDs was spin coated at 1000 rpm out of toluene on a clean silicon chip. The sample was then patterned by EBL with an area exposure dosage of 600 $\mu C/cm^2$ at 20 keV electron acceleration voltage. After patterning, the sample was washed with toluene and dried under an Ar gas flow. A variety of size structures of 500 nm wide to 5 $\mu m$ wide were obtained as can be seen in the bright field and fluorescence images of FIG. 19, obtained with a fluorescent microscope. This example demonstrates the direct writing process for films of semiconducting nanoparticles.

Example 6

Figure 20:
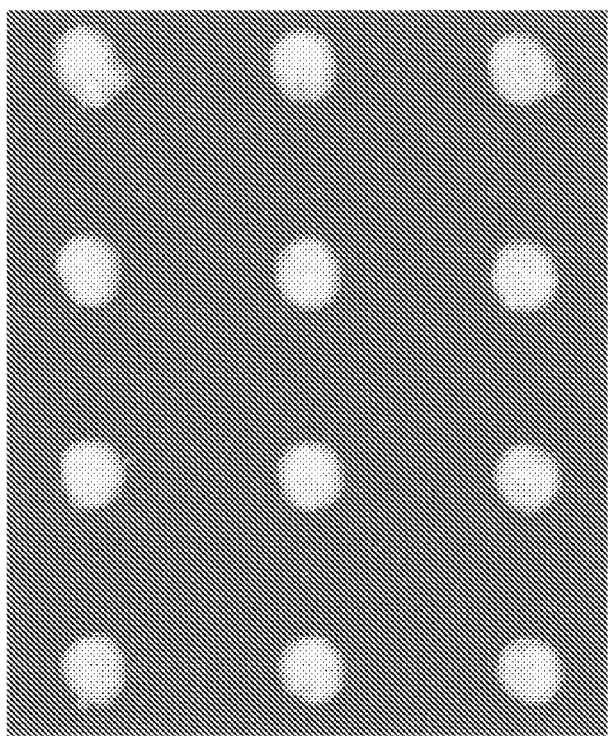
FIG. 20 is a microscopy image of a gold dot array on a SiN membrane obtained by spin coating with pentanethiol capped gold nanoparticles, patterning with EBL, and development.

Fabrication: A SiN membrane substrate was fabricated from a Si wafer coated on both sides with SiN to form a SiN/Si/SiN wafer. First, a section of SiN was removed in a defined small window. Then, the bulk of the silicon wafer was exposed from the back side SiN opening and wet-etched along its (111) crystalline planes in 25 wt % KOH solution at 85° C. to fabricate the suspended SiN membrane. The SiN membrane window was around 100 nm thick. Next, 3 nm pentanethiol coated Au nanoparticles were spin coated out of toluene at 800, 900 and 1000 rpm on different samples. EBL was performed using a dosage of 10000 $\mu c/cm^2$ with a 20 kV e-beam acceleration voltage. After EBL, uncrosslinked nanoparticles were washed from the surface with toluene, leaving 150 nm wide Au dots with heights of 45, 30, and 25 nm. The Au dots are depicted in FIG. 20.

Figure 21:
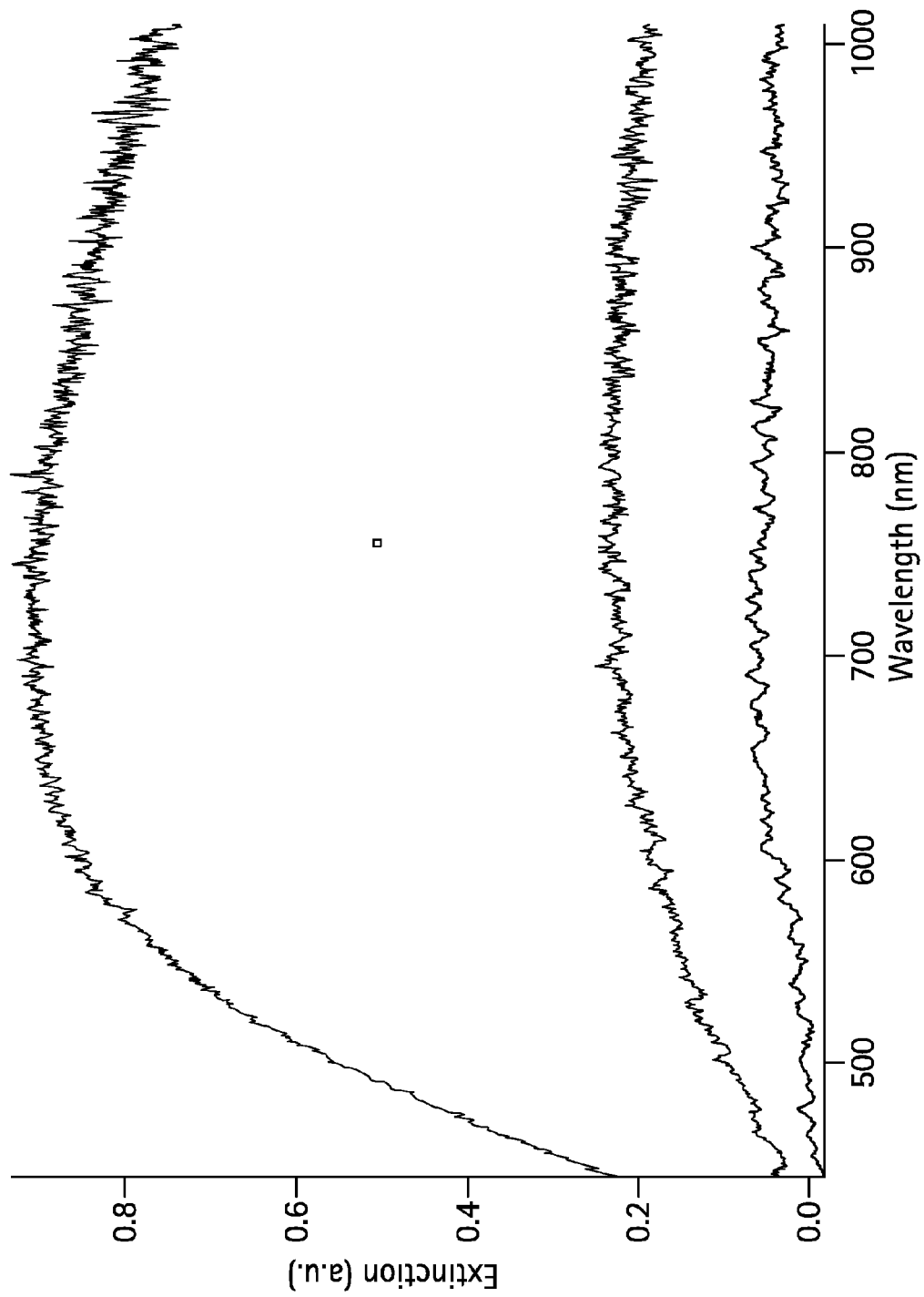
FIG. 21 depicts the extinction spectra of the light transmitted through a 150 nm wide array of Au nano dots on a SiN membrane. The top spectrum is from a 45 nm thick Au dot, the middle spectrum from a 30 nm thick Au dot, and the lower spectrum from a 25 nm thick Au dot.

Measurement: Using a white laser as the light source, the extinction spectra of the transmitted light through the 150 nm wide Au nano dots array on the SiN membrane was measured. The absorption peak's position (wavelength), width, and amplitude can be tuned by changing the size, shape and spacing of the Au dots fabricated by the direct EBL patterning. The spectra obtained at different Au dot thicknesses are given in FIG. 21. The top spectrum was from a 45 nm thick Au dot, the middle spectrum from a 30 nm thick Au dot, and the lower spectrum from a 25 nm thick Au dot. The optical absorption is due to the localized surface plasmon resonance.

Example 7

Standard Gold Electrodes as Leads: The first step is a normal process to produce gold electrodes on the surface of a silicon wafer. A 4% PMMA solution in anisole was spin coated at 2500 rpm on a highly doped Si-wafer with 100 nm of thermal oxide. The sample was baked for 30 minutes at 190° C. A previously designed pattern of interdigitated electrodes was then written in the PMMA using EBL at a dosage of 250 $\mu C/cm^2$. The film was developed using MIBK: isopropyl alcohol (1:3) to remove the exposed PMMA area completely. Metal electrodes were formed by thermal evaporation of 5 nm of Cr, as an adhesion layer, and 50 nm of Au. The lift-off process was then applied by soaking the samples in acetone for 12 hours, resulting in interdigitated electrode structures on the silicon chips.

Pentanethiol Capped Gold Nanoparticles: In a typical synthesis of pentanethiol Au nanoparticles an aqueous solution (150 mL) of $HAuCl_4$ (5.88 mmol) was mixed with a solution of tetraoctylammonium bromide (8.83 mmol) in toluene. The two-phase mixture was vigorously stirred until all the tetrachloroaurate was transferred into the organic layer. Pentanethiol (8.24 mmol) was then added to the organic phase. A freshly prepared aqueous solution of sodium borohydride (117.7 mmol) was slowly added with vigorous stirring. After further stirring for 3 hr the organic phase was separated, evaporated to 10 mL in a rotary evaporator, and washed with 500 mL ethanol to remove excess pentanethiol. The resulting nanoparticles were dispersed in toluene.

Figure 22:
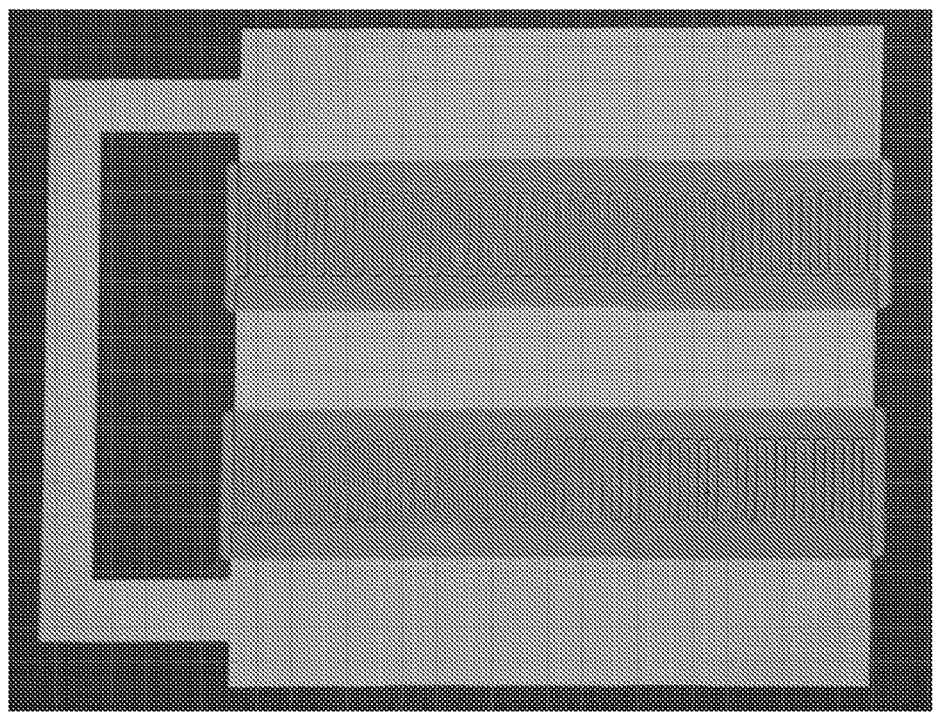
FIG. 22 is a microscopy image of two interdigitated electrodes that have been spin-coated with pentanethiol-capped Au nanoparticles, exposed to EBL over a rectangular area overlapping the two electrodes, and developed.
Figure 23:
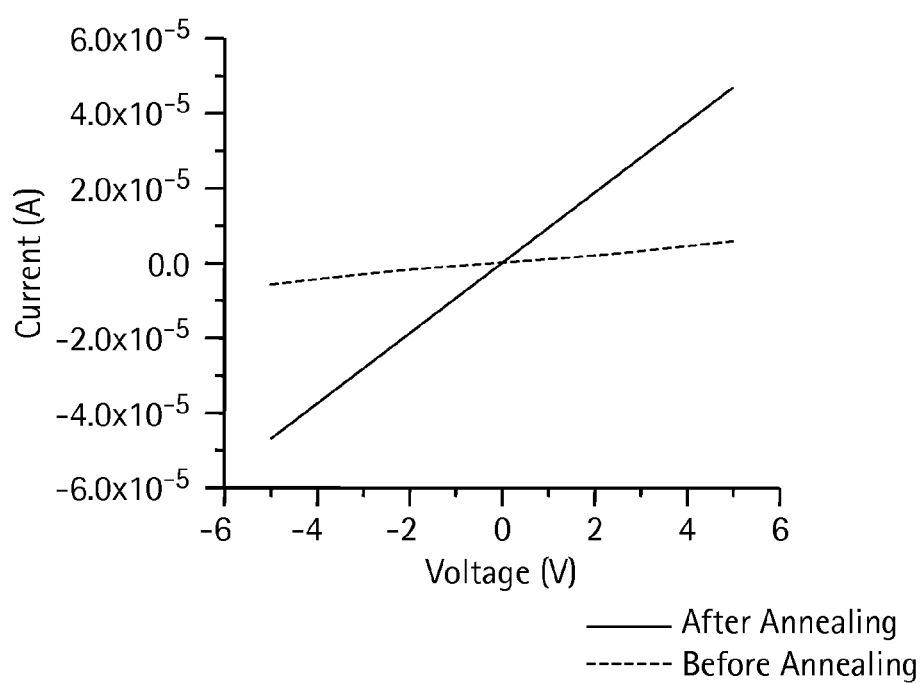
FIG. 23 is a plot of current vs. voltage before and after annealing for two interdigitated electrodes that have been spin-coated with pentanethiol-capped Au nanoparticles, exposed to EBL over a rectangular area overlapping the two electrodes, and developed.

Fabrication: Pre-patterned chips with interdigitated electrode structures were then spin coated with the above nanoparticles solutions at 1000 rpm. The samples were directly written with EBL, using a dosage of 3500 μc/cm$^2$ with 20 kV e-beam acceleration voltage, exposing a rectangular structure overlapping the center of the interdigitated electrodes. After EBL, uncrosslinked nanoparticles were washed from the surface by toluene. The following microscopy image shows electrodes that have been covered and patterned with Au nanoparticles using EBL. FIG. 22 is a microscope image of electrodes that have been coated with Au nanoparticles and patterned by EBL in the process of this example. The as fabricated Au nanoparticles patterned film shows high conductance, which becomes fully ohmic after a short annealing process under nitrogen at 200° C. Current vs. voltage is graphed in FIG. 23 before and after annealing.

Example 8

Pyridine-capped CdSe nanoparticles were synthesized according to the literature method. A Schlenk flask containing 0.0514 g (0.4 mmol) of cadmium oxide, 0.1116 g (0.4 mmol) of TDPA and 3.8744 g (10 mmol) of TOPO was heated to 340-350° C. under Ar flow for 3 hrs resulting in a colorless solution. The temperature of the solution was reduced to 260° C. and a solution of Se containing 0.0263 g (0.33 mmol) of Se powder in 2 mL of TOP was injected. The resulting mixture was cooled to 180° C. by lifting the reaction flask from the heating mantle. The temperature was then raised slowly to 250° C., and the solution was digested at that temperature for 1-2 hours, depending on the required particle size. The resulting nanoparticles were purified by dispersing in hexane followed by precipitation with methanol three times.

In a typical place exchange reaction, 20 mg of TOPO capped CdSe nanoparticles were precipitated from hexane solution by adding methanol. Pyridine (2-3 mL) was added to the precipitate and resulting mixture was heated for 24 hours at 50° C. under Ar atmosphere. After place exchange, the nanoparticles were precipitated a twice with hexanes and redispersed in toluene to remove unreacted nanoparticles.

Figure 24:
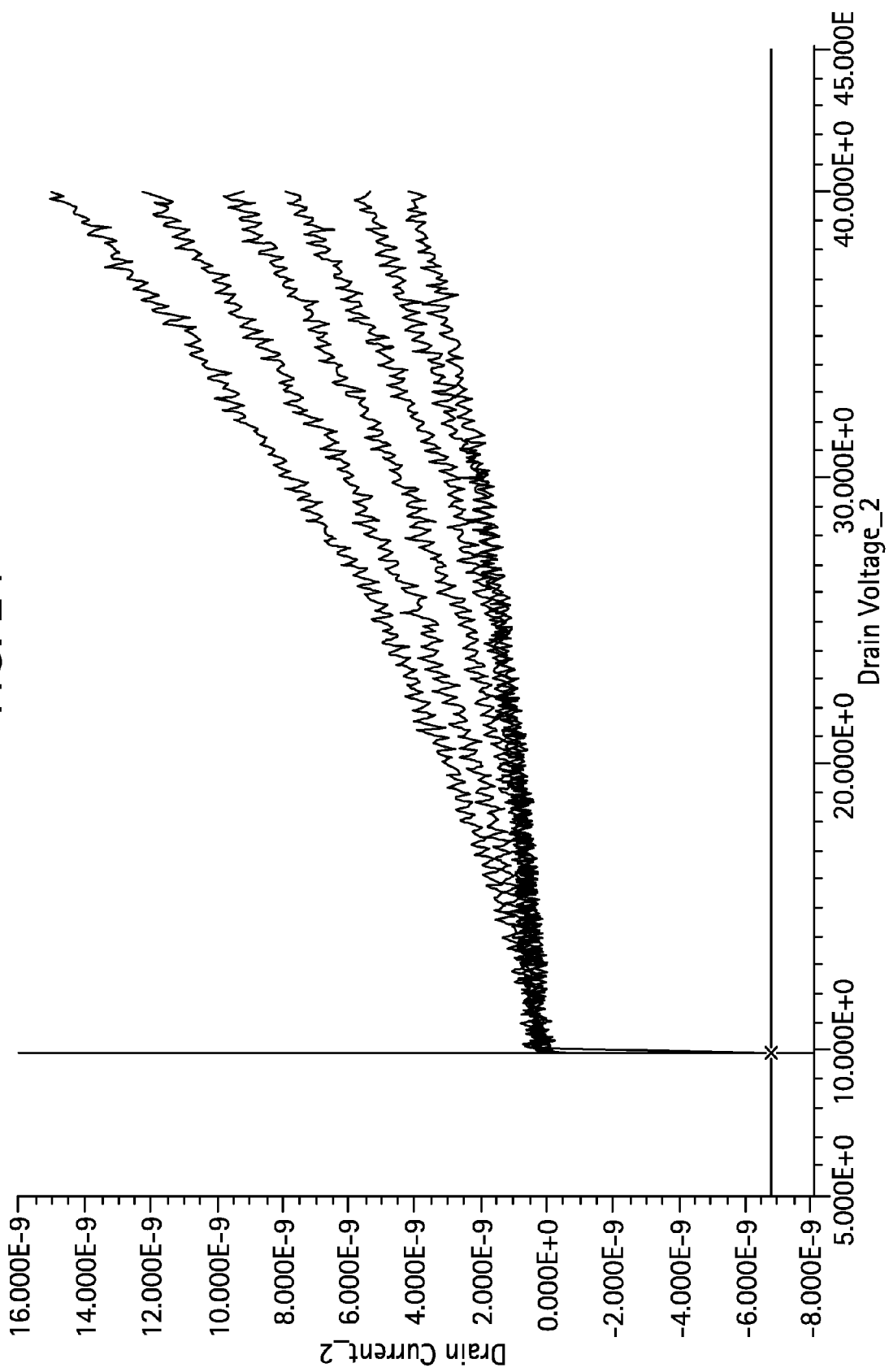
FIG. 24 is a plot of drain current vs. drain voltage for a non-optimized field effect transistor fabricated with pyridine-capped CdSe nanoparticles.

A non-optimized field effect transistor was fabricated. The two outermost electrodes served as drain, the central electrode was the source, and the highly doped silicon substrate was used as the gate electrode. The semi-conducting pyridine-capped CdSe nanoparticles were directly patterned between the source and drain electrodes (3 nm thickness). The transistor was annealed for 12 hr. at 200° C. under a nitrogen atmosphere. A typical I-V output characteristic was obtained, as depicted in FIG. 24.

The terms "first," "second," and the like as used herein do not denote any order, quantity, or importance, but rather are used to distinguish one element from another. The terms "a" and "an" do not denote a limitation of quantity, but rather denote the presence of at least one of the referenced item. Further as used herein "disposed" means that the recited elements are in direct contact with, and fully or partially cover each other. All ranges disclosed within this specification that are directed to the same component or property are inclusive of the stated endpoint, and are independently combinable. All references are incorporated herein by reference in their entirety.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof Therefore, it is intended that the invention not be limited to the particular embodiment disclosed as the best mode contemplated for carrying out this invention, but that the invention will include all embodiments falling within the scope of the appended claims.

What is claimed is:

1. A method for the manufacture of an article, the method comprising:
    forming a layer comprising a plurality of nanoparticles on a surface; and
    exposing a portion of the layer to incident radiation in a defined pattern at a dosage effective to aggregate the nanoparticles in the exposed portion of the layer into a three-dimensional structure, wherein the three dimensional structure has a shape defined by the pattern of the radiation and a height as defined by the dosage of the incident radiation and a thickness of the nanoparticle layer; the three dimensional structure having a channel; the channel being formed on a side of the layer that is opposed to the side that is exposed to the incident radiation.

2. The method of one of claim 1, further comprising forming an additional layer comprising a plurality of nanoparticles on the three-dimensional structure; and exposing a portion of the second layer to incident radiation at a dosage effective to form an additional three-dimensional structure defined by the aggregation of the nanoparticles in the exposed portion of the additional layer; and
    optionally, further comprising repeating the forming and exposing steps at least once more, to form at least a third three-dimensional structure defined by the aggregation of the nanoparticles in the exposed portion of the third layer.

3. The method of claim 1, further comprising removing unexposed portions of the nanoparticle layer.

4. The method of claim 1, further comprising disposing a mask on the layer; and exposing the layer to radiation through the mask.

5. The method of claim 1, wherein the plurality of nanoparticles comprises a combination of a first nanoparticle composition and a second nanoparticle composition; and further comprising selectively removing at least a portion of the aggregated nanoparticles comprising the first composition from the three-dimensional structure to provide a porous three-dimensional structure comprising aggregated particles of the second nanoparticle composition.

6. The method of claim 1, wherein the three dimensional structure is an array of discrete particles, and further comprising removing the substrate from the array of particles to provide free-standing particles having a size and shape defined by the original writing process.

7. The method of claim 6, wherein the free-standing particles are functionalized with an organic molecule, a polymer, a nanoparticle, a nanocrystal, a nanotube, a nanowire, an active pharmaceutical agent, an enzyme, an antibody, an antigen, a metabolite, a polypeptide, a protein, an oligonucleotide, a polynucleotide, or a combination comprising at least one of the foregoing.

8. The method of claim 1, wherein the nanoparticles comprise a metal of Groups 4-12 of the Periodic Table, a semiconductor comprising an element of Periods III-VI of the Periodic Table, a single molecule magnet, a hard magnetic material, a soft magnetic material, a piezoelectric, or a combination comprising at least one of the foregoing materials.

9. The method of claim 8, wherein the nanoparticles comprise a metal oxide, a metal sulfide, a metal selenide, and metal alloy, a polynuclear metal carbonyl cluster, GeSbTe, a chalcogenide alloy, or a combination comprising at least one of the foregoing.

10. The method of claim 8, wherein the nanoparticles comprise a stabilizing ligand.

11. The method of claim 10, wherein the ligand comprises a thiol, a phosphate, a phosphine oxide, an amine, a pyridine, a carboxylic acid, a cyanate, a thiocarbamate, an alcohol, an alkylammonium compound, a phosphazene, an inorganic complex, or a combination comprising at least one of the foregoing ligands.

12. The method of claim 1, wherein the three-dimensional structure is an integrated circuit, a transistor, a GMR device, an exchange spring magnet, a spin valve, an array of symmetric or asymmetric nanorings, an etching mask to pattern an underlying substrate, a master for the preparation of a nanoimprint lithography mold, or a master for the preparation of a micro-contact printing stamp.

13. A method for forming a nanocomposite comprising:
    forming a first layer comprising a plurality of nanoparticles on a substrate;
    exposing a portion of the layer to incident radiation having a defined pattern at a dosage effective to aggregate the nanoparticles in the exposed portion of the layer into an array of individual particles with a shape and size defined by the dosage, location and pattern of the incident radiation;
    removing the unexposed portion to form a channel; the channel being formed on a side of the first layer that is opposed to the side that is exposed to the incident radiation;
    forming a second layer comprising a second plurality of nanoparticles filling the spaces between the individual particles; and
    exposing the second layer to radiation to aggregate the second plurality of nanoparticles to form a continuous phase of aggregated nanoparticles surrounding the array of individual particles.

14. The method of claim 13, wherein the individual particles comprise a hard magnetic material, and the continuous phase comprises a soft magnetic material.

* * * * *